United States Patent [19]

Paulson

[11] Patent Number: 4,635,748

[45] Date of Patent: Jan. 13, 1987

[54] SPEAKER CABINET HAVING INTERACTIVE SPEAKERS

[76] Inventor: Rollie W. Paulson, 6119 9th Ave. South, Gulfport, Fla. 33707

[21] Appl. No.: 830,358

[22] Filed: Feb. 18, 1986

[51] Int. Cl.$^{4}$ .................................... H05K 5/00

[52] U.S. Cl. .................................... 181/145; 181/152; 181/155; 181/156; 181/199

[58] Field of Search .................................... 181/144–147, 181/152, 156, 159, 199, 155

[56] References Cited

U.S. PATENT DOCUMENTS

| | | | |
|---|---|---|---|
| 1,934,932 | 11/1933 | Lindenberg | 181/152 |
| 2,891,629 | 6/1959 | Mercurius | 181/145 |
| 3,142,353 | 7/1964 | Todisco | 181/145 |
| 4,033,430 | 7/1977 | Bolden | 181/145 X |
| 4,178,473 | 12/1979 | Vermeren | 181/145 X |
| 4,437,539 | 3/1984 | Festa | 181/145 |
| 4,482,026 | 11/1984 | Stehlin, Jr. | 181/152 |

*Primary Examiner*—Benjamin R. Fuller

*Attorney, Agent, or Firm*—Ronald E. Smith

[57] ABSTRACT

A speaker cabinet of the type used in stereo systems. A horizontal wall partitions the interior of the cabinet into an upper portion within which is positioned a full range speaker member, and a lower portion within which is positioned a low range speaker member. A pair of laterally spaced ports are formed in the partition wall to allow sound emanating from the low range speaker to enter into the upper portion of the cabinet. A horn associated with the full range speaker is spaced apart therefrom, in non-attached relation thereto to define a space between the full range speaker and the horn. Sound from the low range speaker and from the full range speaker enters into the space between the full range speaker and the horn and mixes so that the sound emanating from the horn is a full-bodied sound characterized by minimal distortion and substantial absence of unpleasing sounds of the type associated with speakers of the prior art.

3 Claims, 3 Drawing Figures

FIG_1
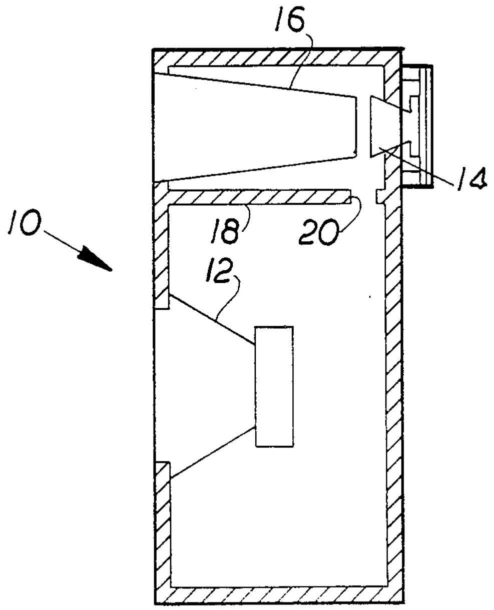
FIG_2
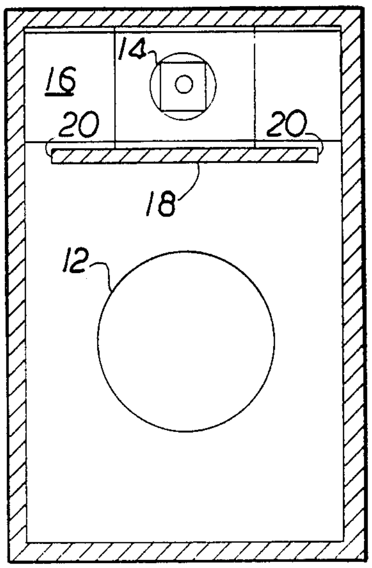
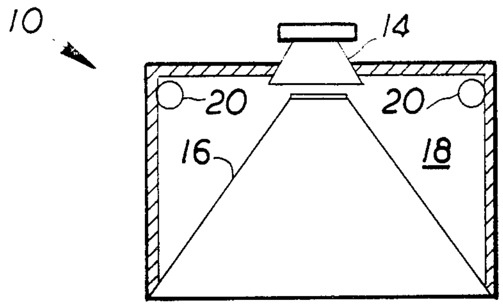
FIG_3

SPEAKER CABINET HAVING INTERACTIVE SPEAKERS

BACKGROUND OF THE INVENTION

1. Field of the Invention

This invention relates, generally, to speaker cabinets, and more particularly relates to speaker cabinets of the type having more than one speaker positioned therein and being provided with means that allow the sounds emanating from the speakers to mix prior to discharge of the sound by a horn member.

2. Description of the Prior Art

A search of United States patents that was conducted prior to the filing of this disclosure revealed that patent protection has been secured for a number of differing speaker cabinet designs.

The speaker systems of the prior art evidence a trend toward better and better designs. The goal of inventors in the art has been to reduce sound distortions, although it is understood that a perfect reproduction of sound may not be attainable. The many inventive efforts made in this field have nevertheless improved the sound reproduction capabilities of speakers to advanced states.

Most of the progress that has heretofore occured in the art, however, has been incremental in nature. Small design changes have been made which have had a beneficial impact on the art, but a breakthrough which would enable the art to post a major advance has eluded those skilled in the art.

SUMMARY OF THE INVENTION

The present invention includes a full range speaker having a horn positioned forwardly thereof in spaced relation thereto so that a space exists between the speaker and horn. Sound from a low range speaker which is positioned below the full range speaker enters into the space and mixes with the full range sound; the mixed sounds then enter into the horn and emanate therefrom in a pleasing mixture that substantially eliminates distortions of all types.

A partition divides the speaker cabinet into upper and lower compartments; the full range speaker is positioned in the upper compartment and the low range speaker is positioned in the lower chamber. A pair of laterally spaced openings are formed in the partition and allow sound from the lower chamber to enter into the upper chamber and hence into the space extant between the full range speaker and the horn.

It is therefore clear that the primary object of the invention is to advance the art of speaker cabinet design in a radical, pioneering way.

A more specific object is to pioneer the art of speaker systems having a horn member spaced apart from one of at least two speaker members so that sound from said plurality of speakers can mix before entering a horn.

Another object is to provide a speaker system that separates a full range speaker from a low range speaker by a partition having one or more openings formed therein to permit sound mixing.

The invention accordingly comprises the features of construction, combination of elements and arrangement of parts that will be exemplified in the construction hereinafter set forth, and the scope of the invention will be indicated in the claims.

BRIEF DESCRIPTION OF THE DRAWINGS

For a fuller understanding of the objects and nature of the invention, reference should be made to the following detailed description, taken in connection with the accompanying drawings, wherein:

FIG. 1 is a side elevational view of an embodiment of a speaker cabinet which illustrates the inventive concept;

FIG. 1 is a front view of the cabinet of FIG. 1;

FIG. 3 is a top view of the cabinet of FIG. 1.

DETAILED DESCRIPTION OF THE PREFERRED EMBODIMENT

Referring now to FIG. 1, it will there be seen that an illustrative embodiment of the invention is designated by the reference numeral 10 as a whole.

Cabinet 10 has a conventional rectangular construction which includes upstanding sidewalls and horizontally positioned top and bottom walls.

A low range speaker 12 is positioned in the lower compartment of cabinet 10 as shown; it is in communication with a conventional opening formed in the front sidewall of the cabinet so that sound emitting therefrom may enter into the environment of the speaker.

A full range speaker 14 is positioned in the upper compartment of speaker 10 as illustrated. Horn 16 is positioned in spaced apart relation to speaker 14, but in axial alignment with it so that sound emanating from speaker 14 enters into said horn 16. The actual amount of spacing between the entrance of horn 16 and speaker 14 may be empirically determined for best results but tests conducted by the inventor indicate that a spacing of about one and one-eighth inches ($1\frac{1}{8}''$) provides good results.

A horizontally disposed partition 18 divides the interior of cabinet 10 into the upper and lower chambers already mentioned; in it are formed a pair of laterally spaced openings 20. Openings 20 allow sound emanating from speaker 12 to enter the upper compartment and to thereby enter into the space between horn 16 and full range speaker 14. Since sound from speaker 14 will also be present in the space when the speakers are operating, a mixture of low range sounds and full range sounds will occur in the space. These mixed sounds will then be discharged from cabinet 10 by horn 16. Of course, sound from bass speaker 12 will continue to emanate from it as well; accordingly, low range sounds will be emitted from the upper and lower compartments of cabinet 10.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. A cabinet for speakers of the type used in stereo systems, comprising:

a cabinet member of generally parallelepiped configuration;

a substantially imperforate partition wall member positioned interiorly of said cabinet member in a horizontal plane;

said partition wall member dividing the interior of said cabinet member into an upper compartment and a lower compartment;

at least one opening formed in said partition wall member to allow sound waves originating in said lower compartment to enter into said upper compartment;

a full range speaker member positioned within said upper compartment;

a low range speaker member positioned within said lower compartment;

a horn member;

said horn member positioned in said upper compartment;

said horn member positioned in spaced apart, axially aligned, non-attached relation to said full range speaker member;

a space defined between said horn member and said full range speaker member by said spaced, non-attached positioning of said full range speaker member and horn member;

said space being occupied by sound emanating from said full range speaker member and from said low range speaker member when said system is operating so that a mixture of sound from said speaker members enters said horn member to provide a full-bodied sound.

2. The speaker member of claim 1, wherein the number of openings formed in said partition wall is two, and wherein said openings are laterally spaced relative to one another.

3. The speaker of claim 1, wherein the amount of space between said full range speaker member and said horn member is one and one-eighth inches.

* * * * *